United States Patent [19]

Woods et al.

[11] Patent Number: 4,675,270

[45] Date of Patent: Jun. 23, 1987

[54] IMAGING METHOD FOR VAPOR DEPOSITED PHOTORESISTS OF ANIONICALLY POLYMERIZABLE MONOMER

[75] Inventors: John G. Woods, Dublin; John M. Rooney, Kildare, both of Ireland

[73] Assignee: Loctite (Ireland) Limited, Dublin, Ireland

[21] Appl. No.: 828,109

[22] Filed: Feb. 10, 1986

[51] Int. Cl.$^4$ .......................... G03C 5/00; G03C 5/04
[52] U.S. Cl. .................................. 430/311; 430/325; 430/330; 430/331; 430/396
[58] Field of Search ............... 430/311, 325, 326, 330, 430/396, 331

[56] References Cited

U.S. PATENT DOCUMENTS

| | | | |
|---|---|---|---|
| 2,313,501 | 3/1943 | Bachman et al. | 260/485 |
| 2,330,033 | 9/1943 | D'Alelio | 260/485 |
| 2,502,412 | 4/1950 | Ardis | 260/465 |
| 2,514,387 | 7/1950 | Gilbert | 260/465 |
| 2,663,725 | 12/1953 | Reuter et al. | 260/465 |
| 2,665,298 | 1/1954 | Ardis | 260/465 |
| 2,748,050 | 5/1956 | Shearer et al. | 154/140 |
| 3,027,278 | 3/1962 | Reick | 117/226 |
| 3,197,318 | 7/1965 | Halpern et al. | 106/208 |
| 3,221,745 | 12/1965 | Coover et al. | 128/334 |
| 3,523,097 | 8/1970 | Coover et al. | 260/30.6 |
| 3,984,253 | 10/1976 | Nelson | 96/35.1 |
| 4,175,963 | 11/1979 | Crivello . | |
| 4,279,894 | 7/1981 | Matsuda et al. | 430/270 |
| 4,364,876 | 12/1982 | Kimura et al. | 260/465.4 |
| 4,395,481 | 1/1983 | Birkle et al. | 430/326 |
| 4,539,250 | 9/1985 | Fuji et al. | 428/195 |
| 4,543,275 | 9/1985 | Akashi . | |
| 4,550,041 | 10/1985 | Thompson et al. | 428/35 |
| 4,577,978 | 12/1985 | Mason . | |
| 4,604,344 | 8/1986 | Woods et al. | 430/325 |

FOREIGN PATENT DOCUMENTS

| | | |
|---|---|---|
| 48899 | 9/1981 | European Pat. Off. . |
| 105244 | 8/1980 | Japan . |
| 1168000 | 10/1969 | United Kingdom . |
| 1298453 | 12/1969 | United Kingdom . |

OTHER PUBLICATIONS

IBM Technical Disclosure Bulletin, vol. 16, No. 11, Apr. 1974, 3745.
Chem. Abst. 99: 185932 (Abstract of J83 123727).
Chem. Abst 99: 159393 (Abstract of J83 108213).
Derwent Abstract, WPI Acc. #82: 56185E/27 (Abstract for J 83 87404).

*Primary Examiner*—John E. Kittle
*Assistant Examiner*—Patrick J. Ryan
*Attorney, Agent, or Firm*—Vidas & Arrett

[57] ABSTRACT

A method for imaging vapor deposited photoresists of cyanoacrylates or related anionically polymerizable monomers without the use of solvent development. This method consists of treating the substrate with a compound which releases acid when exposed to high-energy radiation. In certain cases when the surface of the substrate is slightly acidic or neutral, it is necessary to activate the surface with a basic liquid or vapor which must be chosen so as not to react with the radiation-sensitive acid precursor. The substrate is exposed to actinic or ionizing radiation through a mask or to steered high-energy beams. Finally, the substrate is exposed to a vapor of cyanoacrylate monomer which condenses and polymerizes on the unirradiated regions forming a relief image.

15 Claims, No Drawings

IMAGING METHOD FOR VAPOR DEPOSITED PHOTORESISTS OF ANIONICALLY POLYMERIZABLE MONOMER

BACKGROUND OF THE INVENTION

The use of polymeric alkyl cyanoacrylates as resist materials for microlithography is known in the art. For example: *IBM Technical Disclosure Bulletin*, Vol. 16, No. 11, April 1974, p. 3745, discloses the use of poly methyl alpha cyanoacrylate homopolymers and copolymers as high-speed positive electron-beam resists; Japan Pat. No. 80/21,332 discloses the use of poly butyl cyanoacrylate as a positive-working high sensitivity electron-beam resist; Japan Pat. No. 80/105,244 discloses the use of poly ethyl cyanoacrylate as a positive-working electron-beam resist; U.S. Pat. No. 4,279,984 discloses the use of homopolymers and copolymers of lower alkyl cyanoacrylates as positive-working high-energy radiation resists; Eur. Pat. No. 48,899 discloses the use of copolymers of alkyl cyanoacrylates as positive-working resists; Japan Pat. No. 82/87,404 discloses the use of polymeric fluoroalkyl cyanoacrylates as electron beam resists; Japan Pat. No. 83/113,933 discloses the use of copolymers of fluoroalkyl acrylates and alkyl cyanoacrylates as resist materials; Japan Pat. No. 83/108,213 dislcoses the use of alkyl cyanoacrylate polymers as positive-working radiation resists; and Japan Pat. No. 83/123,727 discloses the use of alkyl cyanoacrylate polymers and azido crosslinking agents as negative-working radiation resists.

In the prior art, the method of applying the resist materials to the substrate is by spin-coating a solution of the cyanoacrylate polymer onto the substrate. This procedure requires that the polymer is prepared in advance of the application and then dissolved in a suitable solvent. The solution must be filtered to remove particles of dust before application. After application, the coated substrate must be baked to remove residual solvent. Preparation of cyanoacrylate polymers in large quantities is complicated by the high reactivity of the monomers and the strongly exothermic nature of the polymerization.

After polymerization, the polymeric cyanoacrylate must then be precipitated to remove impurities such as initiators and inhibitors, a procedure which consumes large amounts of solvent. The purified polymer must then be redissolved in a suitable solvent for spin-coating. This requirement places a limitation on the types of solvent and polymer molecular weights which may be used. For example, poly methyl cyanoacrylate is soluble in very few solvents, such as nitromethane and dimethylformamide. In general, it is very difficult to spin-coat films of cyanoacrylate polymers with molecular weights in excess of 1,000,000, as stated in U.S. Pat. No. 4,279,984, Col. 2, lines 23-28. However, films formed from polymers below this molecular weight are easily removed by common organic solvents necessitating shortened developing times as stated in U.S. Pat. No. 4,279,984, Col. 3, lines 60-68 and Col. 4, lines 1-9. A further disadvantage of the spin-coating process is that attempts to coat a patterned substrate result in uneven coating thicknesses, i.e., the coating is thicker in depressed regions than in raised regions. One method of overcoming this problem involves the use of multilayer resists. However, applying to or three layers and using two or three image development steps increases the cost and complexity of the lithographic process.

In the prior art, the method of imaging the cyanoacrylate-based resists involves spin-coating a solution of cyanoacrylate polymer onto the substrate and exposing the coated surface to high-energy radiation through a mask or to steered high-energy beams. In the case of positively imaged resists, the exposed portions of the coating are then removed by treatment with solvent, and in the case of a negatively imaged resist the unexposed portions are removed by solvent. This solvent development step inevitably results in some degree of distortion of that portion of the coating which is to remain on the substrate and form a relief image.

Cyanoacrylate monomer vapors have recently been utilized as a fingerprint developer. A detailed discussion of such techniques is included in U.S. Pat. No. 4,550,041.

In a related invention, the applicants here have discovered that resist coatings of cyanoacrylate polymers or other polymers of monomers of the formula $CHR=CXY$, where X and Y are strong electron withdrawing groups and R is H or, if X and Y are $-CN$, alkyl, can be formed by direct deposition of polymer on the substrate from monomer vapors. Such polymeric coatings can be positively imaged in the same manner as prior art cyanoacrylate resist coatings but give much higher molecular weight polymers which diplay significantly improved plasma etch resistance.

SUMMARY OF THE INVENTION

The present invention provides a method for imaging vapor deposited photoresists of cyanoacrylates or related anionically polymerizable monomers without the use of solvent development. This method consists of treating the substrate with a compound which releases acid when exposed to high-energy radiation. In certain cases when the surface of the substrate is slightly acidic or neutral, it is then necessary to activate the surface with a basic liquid or vapor which must be chosen so as not to react with the radiation-sensitive acid precursor. The substrate is exposed to actinic or ionizing radiation through a mask or to steered high-energy beams. Finally, the substrate is exposed to a vapor of cyanoacrylate monomer which condenses and polymerizes on the unirradiated regions forming a relief image.

In one aspect, the invention is an imaging method which comprises (a) providing a substrate having a surface reactive to activate polymerization of a monomer defined by the formula:

$$CHR=CXY, \qquad I$$

where X and Y are strong electron withdrawing groups and R is H or, provided X and Y are both $-CN$, $C_1$-$C_4$ alkyl;

(b) treating the surface of the substrate with a photosensitive compound which releases an acid when exposed to actinic of ionizing radiation;

(c) imgewise exposing the substrate to radiation of an energy effective to release said acid from said photosenitive compound, and (d) exposing the substrate to vapors of one of said monomers for sufficient time to form a polymeric coating over the substrate in the areas thereof not exposed to the radiation.

A further aspect of the invention comprises an imaged article prepared by the foregoing inventive process.

Among the advantages of the invention are the following features:

1. Current C.A. resists require deep UV or high energy radiation to form an image. This invention allows mid UV or even visible light to be used (depending on absorption of latent acid material). In the inventive process, radiation response can be adjusted by changing the nature of the acid precursor. For example, long wavelength UV response can be obtained by the use of pyrylium salts; mid-UV response can be obtained by the use of diazonium or sulfonium salts; and deep UV response can be obtained by the use of iodonium salt photoinitiators.

2. As polymer is not formed in imaged sites, development does not require use of aggressive solvents.

3. Current positively imaged photoresist materials are formed by a polymer degradation mechanism which requires relatively high doses of radiation. By comparison, the present development relies on preventing polymerization in the imaged areas and only low doses of radiation are necessary to ensure acid formation.

DETAILED DESCRIPTION OF THE INVENTION

The preferred monomers for use in the inventive process are cyanoacrylate esters, vinylidene cyanide and dialkyl methylene malonates. The well known cyanoacrylate monomers are especially preferred and many are commercially available as "instant" adhesives. The cyanoacrylate monomers have the formula:

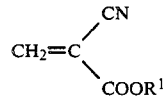

wherein $R^1$ represents a hydrocarbyl or substituted hydrocarbyl group such as a straight chain or branched chain alkyl group having 1 to 12 carbon atoms (which may be substituted with a substituent such as a halogen atom or an alkoxy group) a straight chain or branched chain alkenyl group having 2 to 12 carbon atoms, a straight chain or branched chain alkynyl group having 2 to 12 carbon atoms, a cycloalkyl group, an aralkyl group or an aryl group. Specific examples of the groups for $R^1$ are a methyl group, an ethyl group, an n-propyl group, an isopropyl group, an n-butyl group, an isobutyl group, a pentyl group, a hexyl group, an allyl group, a methallyl group, a crotyl group, a propargyl group, a cyclohexyl group, a benzyl group, a phenyl group, a cresyl group, a 2-chloroethyl group, a 3-chloropropyl group, a 2-chlorobutyl group, a trifluoroethyl group, a 2-methoxyethyl group, a 3-methoxybutyl group and a 2-ethoxyethyl group.

Preferred cyanoacrylate are alkyl cyanoacrylates having 1-6 carbon atoms. Ethyl and isobutyl cyanoacrylates are especially preferred.

The monomer vapors are most suitably generated from the monomers. This may be done at ambient temperatures and pressures but it is generally preferred to heat the monomers and/or reduce the atmospheric pressure above the monomer generated chamber in order to generate sufficient concentrations of vapor to accomplish the polymer deposition on the substrate in a reasonable time.

As an alternative to vapor generation from monomers, cyanoacrylate polymers which are heated above their depolymerization temperatures, typically about 150° C., may be used as a monomer vapor source. In particular, vapors generated from thermal removal of resist coatings may be recirculated, a feature which has significant environmental advantages.

Concentrated cyanoacrylate monomer vapors may also be generated by other techniques well known in the fingerprint development art and summarized in U.S. Pat. No. 4,550,041.

While the cyanoacrylate ester monomers are preferred because of their ready availability, better known handling properties and low depolymerization temperatures, other anionically polymerizable monomers encompassed within Formula I above may also be usefully employed. As used herein, the term "strong electron withdrawing groups" refers to groups which are more electron withdrawing than halo. Generally, the electron withdrawing groups X and Y may be independently selected from —SO$_2$R; SO$_3$R; —CN; —COOR$^1$ and —COR$^2$, where R$^1$ is as previously defined and R$^2$ is H or hydrocarbyl, preferably C$_1$-C$_{12}$ hydrocarbyl. Vinylidene cyanide, in particular, is known to give especially insoluble polymeric products. Vinylidene cyanide and its lower alkyl homologs may be obtained, for instance, by processes described in U.S. Pat. Nos. 2,313,501; 2,502,412; 2,514,387; 2,663,725, and 2,665,298, the disclosures of which are incorporated herein by reference. Other anionically polymerizable monomers within the scope of Formula I include: dialkyl methylene malonates as described in U.S. Pat. No. 2,330,033; 3,197,318; 3,221,745 and 3,523,097; acylacrylonitriles as described in GB 1,168,000; and vinyl sulfinates and sulfonates of the formula CH$_2$=CXY where X is —SO$_2$R$^2$ or —SO$_3$R$^2$ and Y is —CN, —COOR2, —COCH$_3$, —SO$_2$R$^2$ or —SO$_3$R$^2$, as described in U.S. Pat. No. 2,748,050.

Virtually, any substrate upon which a polymeric image is desired may be utilized in the inventive process. Most advantageously, the substrates will be ones which undergo subsequent acid or plasma etching during which the polymer coating serves as an etch resist. Suitable substrate materials include silicon dioxide, including SiO$_2$ coated silicon, metallic oxides, and glass, all of which may be etched by plasma or acid etching processes. Metallic substrates which can be etched by acid processes, such as copper coated epoxy/glass boards used in printed circuit board manufacture and metal printing plates may also be utilized in the inventive process. Where the inventive process is used to produce an etch resist, the resist coating may be removed after etching by heating the substrate above the depolymerization temperature of the polymer, preferably under vacuum.

The preferred substrate is SiO$_2$ coated silicon, eg., the silicon chips conventionally used in preparation of semiconductor devices. Most suitably, this substrate is etched by a plasma etching process. Surprisingly, the high molecular weight cyanoacrylate polymers produced by the inventive process have a significantly greater etch resistance than spin coated cyanoacrylate polymer resists.

Very high molecular weight polymer is formed by the inventive process. This is evidenced by the inability of agressive solvents such as dichloromethane to dissolve the coating. As noted above, however, the coating is readily removed by heating above the depolymerization temperature of the polymer. For cyanoacrylate polymers, the depolymerization temperature is only about 150°–200° C. so the coating removal step will not harm the typical substrate.

If the substrate surface is inherently active for inducing anionic polymerization of cyanoacrylates, or such other monomer within Formula I as may be employed, no surface treatment will be necessary to obtain the desired high molecular weight uniform coatings. In certain cases, however, where the substrate is slightly acidic or neutral it is necessary to activate the surface with a basic liquid or vapor which is substantially removed before exposing the substrate to the monomer vapor. Suitable activators include the known initiators for anionic or zwitterionic polymerization of alkyl cyanoacrylates. Especially suitable activators are organic amines and phosphines.

Compounds which release acid upon irradiation include any compounds which release Lewis or protonic acids such as those known as photoinitiators for cationically polymerizable resins such as epoxies or vinyl ethers. Additionally included are compounds which release sulfonic acids upon irradiation and are known as photolytically releasable latent thermal catalysts for acid curable stoving lacquers. The compounds, of course, should not produce an irradiation by product which initiates cyanoacrylate polymerization. Thus, amine salts are not recommended.

Suitable radiation sensitive acid precursors useful in the inventive method include salts of complex halogenides represented by the formula $$[A]_d^+[MX_e]^{-(e-f)}$$

wherein A is a cation selected from iodonium iodosyl, Group VIa onium, pyrylium, thiopyrylium, sulfonylsulfoxonium, and diazonium, M is a metal or metalloid, X is a halogen radical, $d = e - f$, $f =$ the valence of M and is an integer equal to from 2 to 7 inclusive and e is $> f$ and is an integer having a value up to 8; compounds of the formula $$R[O.SO_2.CQ_3]_n$$

wherein R is an organic radical of valency 1 to 4 and Q is hydrogen or fluorine and n is an integer from 1 to 4; and compounds which release sulfonic acids when irradiated such as those disclosed in U.S. Pat. Nos. 4,504,372 and 4,510,290, both incorporated herein by reference.

The acid generating compound may be applied neat or in a solvent which is subsequently evaporated. If a surface activator is also be applied to the substrate, both the activator and the acid generating compound may be applied simultaneously in a common solvent. Alternatively, the activator may be applied before or after application of the acid generating compound.

Only trace amounts of surface activator and acid generating compound are necessary. Mirror finish substrates may be repolished, e.g. with a suitable tissue, after application of these compounds and still retain sufficient activator and acid generator to give sharply imaged resists after irradiation and exposure to monomer vapor.

The invention is further illustrated by the following non-limiting examples.

EXAMPLE 1

A polished silicon wafer 3 inches in diameter was treated with three drops of UVE 1014 (trademark of General Electric), a commercially available salt of a complex halogenide, which were brushed uniformly across the surface of the wafer. The wafer was then polished with a paper tissue to restore the mirror finish. Three drops of N,N,N',N'-Tetramethyl Ethylene Diamine (TMEDA) were brushed uniformly across the surface of the wafer, which was then polished with a paper tissue again to restore the mirror finish. One half of the wafer surface was covered with a metal plate and the wafer was exposed to the output of a medium-pressure mercury arc (200 watts per linear inch power rating) at a distance of 10 centimeters for 10 seconds. At the end of this time, the metal plate was removed and the wafer mounted perpendicular to the shaft of a stirring motor with a variable speed adjustment. The wafer was rotated at a speed of about 35 revolutions per minute and lowered into a 1 liter polyethylene beaker containing 0.5 grams of ethyl cyanoacrylate monomer. The wafer was lowered to a depth about 10 cm above the bottom of the beaker, which was heated to a temperature of 60° C. on a hot plate apparatus. After two minutes exposure, the wavfer was removed from the vapor. The half of the wafer which had not been exposed to the ultraviolet radiation was covered by a uniform film of cyanoacrylate polymer. The other half of the wafer remained uncoated.

EXAMPLE 2

The experiment described in Example 1 was repeated with the exception that in place of the UVE 1014 the wafer was treated with 10 drops of a 50 weight percent solution of benzoin dodecylbenzene sulfonate in propylene carbonate; the wafer was exposed to the ultraviolet radiation source for 30 seconds; and the wafer was exposed to the ethyl cyanoacrylate vapor for 6 minute. At the end of that time, the half of the wafer which had not been exposed to the ultraviolet radiation was covered by a uniform film of cyanocrylate polymer. The other half of the wafer remained uncoated.

EXAMPLE 3

The experiment described in Example 1 was repeated with the exception that in place of the metal plate the wafer was covered with a patterned mask. After exposure to the cyanoacrylate vapor, a relief image corresponding to the pattern on the mask had been developed on the wafer surface.

EXAMPLE 4

The experiment described in Example 1 was repeated with the exception that in place of the UVE 1014 the wafer was treated with 3 drops of a 15 weight percent solution of 2,6-bis(4-methoxyphenyl)-4-phenyl pyrylium hexafluoroantimonate in propylene carbonate; the wafer was exposed to the ultraviolet radiation source for 60 seconds; and the wafer was exposed to the ethyl cyanoacrylate vapor for 2 minutes. At the end of that time, the half of the wafer which had not been exposed to the ultraviolet radiation was covered by a uniform film of cyanoacrylate polymer. The other half of the wafer remained uncoated.

EXAMPLE 5

The experiment described in Example 1 was repeated with the exception that in place of the UVE 1014 the wafer was treated with 5 drops of PP-33 (trademark of Asahi Denka), a commercially available diazonium salt photoinitiator solution; the wafer was exposed to the ultraviolet radiation source for 30 seconds; and the wafer was exposed to the cyanoacarylate vapor for 2 minutes. At the end of that time, the half of the wafer which had not been exposed to the radiation was covered by a film of cyanoacrylate polymer. The other half of the wafer remained uncoated.

EXAMPLE 6

The experiment described in Example 1 was repeated with the exception that in place of the UVE 1014 the wafer was treated with 5 drops of a 25 weight percent solution of di(p-tolyl)iodonium hexafluorophosphate in propylene carbonate; the wafer was exposed to the ultraviolet radiation through a photographic negative, part of which was covered by a 10 mm thick glass plate, for 60 seconds; and the wafer was exposed to the cyanoacrylate vapor for 2 minutes. At the end of that time, a relief image corresponding to the pattern of the photographic negative had been developed on that part of the wafer not covered by the glass plate. The part of the wafer covered by the glass plate was covered by a uniform film of cyanoacrylate polymer approximately 0.2 microns in depth.

EXAMPLE 7

The experiment described in Example 1 was repeated with the exception that in place of the UVE 1014 the wafer was treated with 5 drops of a solution of 103 milligrams of di(p-tolyl)iodonium hexafluorophosphate and 81 milligrams of 2,2-dimethoxy-2-phenylacetophenone dissolved in 303 milligrams of propylene carbonate; the wafer was exposed to the ultraviolet radiation through a photographic negative which was entirely covered by a 10 mm thick glass plate for 60 seconds; and the wafer was exposed to the cyanoacrylate vapor for 5 minutes. At the end of that time, a relief image corresponding to the pattern of the photographic negative had been developed on the wafer.

EXAMPLE 8

The experiment described in Example 1 was repeated with the exception that in place of the UVE 1014 the wafer was treated with 5 drops of a 16 weight percent solution of 2-methylsulfonyloxy benzophenone in propylene carbonate; the wafer was exposed to the ultraviolet radiation for 60 seconds; and the wafer was exposed to the cyanoacrylate vapor for 2 minutes. At the end of that time, the half of the wafer which had been shielded from the ultraviolet radiation was covered by a film of cyanoacrylate polymer. The other half of the wafer remained uncoated.

EXAMPLE 9

A glass microscope slide (1"×4") was treated with 2 drops of UVE-1014, which were brushed uniformly across the surface of the slide. The slide was then polished with a paper tissue, and exposed through a patterned mask to the output of a medium-pressure mercury arc (200 watts per linear inch power rating) at a distance of 10 centimeters for 20 seconds. At the end of this time, the mask was removed and the slide was mounted perpendicular to the shaft of a stirring motor with a variable speed adjustment. The slide was rotated at a speed of about 35 revolutions per minute and lowered into a 1 liter polyethylene beaker containing 0.5 grams of ethyl cyanoacrylate monomer. The slide was lowered to a depth about 10 cm above the bottom of the beaker, which was heated to a temperature of about 50° C. on a hot plate apparatus. After 3 minutes exposure, the slide was removed from the vapor. A relief image corresponding to the pattern of the mask had been developed on the surface of the slide.

EXAMPLE 10

The experiment described in Example 1 was repeated with the exception that in place of the UVE-1014 the wafer was treated with 3 drops of a 33 weight percent solution of ($\eta$6-cumene) ($\eta$5-cyclopentadienyl)-iron (II)-hexafluorophosphate in propylene carbonate; the wafer was exposed to the ultraviolet radiation for 180 seconds; and the wafer was exposed to the cyanoacrylate vapor for 3 minutes. At the end of that time, the half of the wafer which had been shielded from the ultraviolet radiation was covered by a film of cyanoacrylate polymer. The other half of the wafer remained uncoated.

We claim:

1. An imaging method comprising
   (a) providing a substrate having a surface reactive to activate polymerization of a monomer defined by the formula:

$$CHR=CXY$$

where X and Y are strong electron withdrawing groups and R is H or, provided X and Y are both cyano grops, $C_1$–$C_4$ alkyl;
   (b) treating the surface of the substrate with a photosensitive compound which releases an acid when exposed to actinic or ionizing radiation;
   (c) subsequently image wise exposing the substrate to radiation of an energy effective to release said acid from said photosensitive compound; and then
   (d) exposing the substrate to vapors of one of said monomers for sufficient time to form a polymeric coating over the substrate in the areas thereof not exposed to the radiation.

2. A method as in claim 1 where the monomer is selected from the group consisting of 2-cyanoacrylate esters, vinylidene cyanide and its $C_1$–$C_4$ alkyl homologs, dialkyl methylene malonates, acylacrylonitriles, and vinyl sulfinates of sulfonates of the formula $CH_2=CXY$ where X is $-SO_2R^2$ or $SO_3R^2$ and Y is selected from $-CN$, $-COOR^2$, $-COCH_3$, $-SO_2R^2$ or $SO_3R^2$, and $R^2$ is H or hydrocarbyl.

3. A method as in claim 2 where the monomer is cyanoacrylate ester.

4. A method as in claim 3 where the monomer is ethyl or isobutyl cyanoacrylate.

5. A method as in claim 1 wherein the substrate is $SiO_2$ coated silicon.

6. An imaging method as in claim 1 wherein the substrate surface is activated prior to the irradiation step (c), to induce polymerization of said monomer by treatment with an initiator of anionic or Zwitterionic polymerization of alkyl cyanoacrylates before, during or after treatment with the photosensitive compound.

7. A method as in claim 6 wherein the said initiator is an amine or phosphine compound.

8. A method as in claim 1 further comprising etching the substrate by an acid or plasma etching technique after exposing the substrate to the monomer vapors whereby the said polymeric coating is employed as an etching mask.

9. A method as in claim 8 further comprising removing the imaged polymeric coating from the substrate after etching by heating to a temperature above the polymer depolymerization temperature.

10. A method as in claim 9 where the monomer is a cyanoacrylate ester.

11. A method as in claim 10 where the heating step comprises heating the coating to a temperature between 150° C. and 200° C.

12. An article having a surface bearing a polymeric image thereon, the image prepared by the method of claim 1.

13. An article as in claim 12 wherein the polymeric image is a polymer of a cyanoacrylate monomer.

14. An article as in claim 12 where the polymer image is less than 0.1 micron thick.

15. An article as in claim 12, the article comprising a $SiO_2$ coated silicon wafer.

* * * * *

UNITED STATES PATENT AND TRADEMARK OFFICE
CERTIFICATE OF CORRECTION

PATENT NO.  : 4,675,270
DATED       : June 23, 1987
INVENTOR(S) : Woods et al

It is certified that error appears in the above-identified patent and that said Letters Patent is hereby corrected as shown below:

Column 2, line 62, "imgewise" should be -imagewise-.

Column 6, line 27, "wavfer" should be -wafer-.

Column 6, line 41, "minute" should be -minutes-.

Signed and Sealed this

Third Day of November, 1987

Attest:

DONALD J. QUIGG

Attesting Officer

Commissioner of Patents and Trademarks